(12) United States Patent
Tuten

(10) Patent No.: US 7,796,067 B2
(45) Date of Patent: Sep. 14, 2010

(54) CURVATURE CORRECTION METHODOLOGY

(75) Inventor: Derrick Tuten, Scottsdale, AZ (US)

(73) Assignee: Standard Microsystems Corporation, Hauppage, NY (US)

( * ) Notice: Subject to any disclaimer, the term of this patent is extended or adjusted under 35 U.S.C. 154(b) by 0 days.

(21) Appl. No.: 12/317,314

(22) Filed: Dec. 22, 2008

(65) Prior Publication Data

US 2009/0251343 A1     Oct. 8, 2009

Related U.S. Application Data

(60) Provisional application No. 61/043,202, filed on Apr. 8, 2008.

(51) Int. Cl.
   *H03M 1/06*     (2006.01)
(52) U.S. Cl. .................. 341/119; 341/144; 341/138
(58) Field of Classification Search .............. 341/155, 341/141, 118, 120, 140, 138
   See application file for complete search history.

(56) References Cited

U.S. PATENT DOCUMENTS

| | | | | |
|---|---|---|---|---|
| 4,282,578 A | * | 8/1981 | Payne et al. ................ | 702/86 |
| 4,894,656 A | * | 1/1990 | Hwang et al. ............... | 341/120 |
| 4,903,024 A | * | 2/1990 | Evans et al. ................ | 341/120 |
| 5,440,305 A | * | 8/1995 | Signore et al. ............. | 341/120 |
| 6,018,700 A | * | 1/2000 | Edel ............................ | 702/60 |
| 6,191,714 B1 | * | 2/2001 | Langenbacher ............ | 341/118 |
| 6,891,491 B2 | * | 5/2005 | Nakamura et al. ......... | 341/155 |
| 7,046,180 B2 | * | 5/2006 | Jongsma et al. ............ | 341/141 |
| 7,626,530 B2 | * | 12/2009 | Lang et al. .................. | 341/155 |
| 2009/0167575 A1 | * | 7/2009 | Mitani et al. ............... | 341/118 |

* cited by examiner

*Primary Examiner*—Peguy JeanPierre
(74) *Attorney, Agent, or Firm*—Donald J Lenkszus

(57) ABSTRACT

A method is provided to produce an error corrected digital output from a temperature measurement system that generates digital outputs representative of the output of one or more temperature sensors. In an embodiment of the invention the method comprises: storing in a plurality of memory locations corresponding error correction data, with each memory location having a correlation to a corresponding range of the digital outputs; utilizing each digital output to identify a corresponding one of the memory locations; accessing the corresponding one memory location to obtain error correction data specific to the digital output; and utilizing the error correction data specific to the digital output to correct the digital output, whereby an error corrected digital output is generated.

20 Claims, 2 Drawing Sheets

CURVATURE CORRECTION METHODOLOGY

RELATED APPLICATION

This application is a continuation of and claims priority from Provisional Application Ser. No. 61/043,202 filed Apr. 8, 2008 which is assigned to the assignee of this application. The entirety of that application is specifically incorporated herein by reference.

FIELD

The present invention relates to a method for error correction in sensors and measurement systems, in general, and to a method for correcting non-linear temperature sensor and measurement system errors, in particular.

BACKGROUND

Every measurement system has temperature dependence. From the ruler that expands and contracts with heat and cold, to the silicon based Analog-to-Digital converter that converts analog signals to digital signal representations and is specified by its temperature non-linearity, to the act of measuring temperature itself, all measurements have errors due to temperature.

SUMMARY

A method is provided to produce an error corrected digital output from a temperature measurement system that generates digital outputs representative of the output of one or more temperature sensors. In an embodiment of the invention the method comprises:

storing in a plurality of memory locations corresponding error correction data, with each memory location having a correlation to a corresponding range of the digital outputs;

utilizing each digital output to identify a corresponding one of the memory locations;

accessing the corresponding one memory location to obtain error correction data specific to the digital output; and utilizing the error correction data specific to the digital output to correct the digital output, whereby an error corrected digital output is generated.

Still further in accordance with an aspect of the invention, the method of the embodiment comprises providing a processing unit to operate on each digital output with the error correction data to generate the corrected digital output. The error correction data of the embodiment includes offset data and slope data.

The error correction data is obtained from a piece-wise linear approximation of a characteristic error curve for the temperature measurement system.

In the embodiment a plurality of linear segments of the piece-wise linear approximation is determined from predetermined acceptable error limits. Each segment of is used to determine corresponding error correction data.

Still further in accordance with the embodiment the temperature measurement system is provided on a single integrated circuit. Circuitry is provided to operate on each said digital output with the error correction data to generate the corrected digital output.

Still further in accordance with the embodiment of the invention, at least one temperature sensor is provided on the integrated circuit.

Further in accordance with the principles of the invention, a method for providing an error corrected digital output from a temperature measurement system generating digital outputs representative of the output of one or more temperature sensors, comprises:

providing a plurality of error correction information sets for the measurement system;

storing the plurality of error correction information sets in a corresponding plurality of memory locations;

associating each of each memory location to a corresponding range of the digital outputs;

utilizing each digital output to identify a corresponding one of the memory locations;

accessing the corresponding one memory location to obtain a corresponding error correction information set; and utilizing the corresponding error correction data set to correct the digital output, whereby an error corrected digital output is generated.

BRIEF DESCRIPTION OF THE DRAWING

The features, functions, and advantages of the invention will be better understood from a reading of the following detailed description of an embodiment of the invention in which, like reference designators identify like elements, and in which.

DETAILED DESCRIPTION

The following description of the various preferred embodiment(s) is merely exemplary in nature and is in no way intended to limit the present disclosure, its application, or uses.

The present invention takes advantage of the fact that temperature effects are repeatable. Because the effects are repeatable, they can be characterized and therefore corrected for after the measurement is complete as long as the temperature of the measurement system is accurately known.

Figure 1:
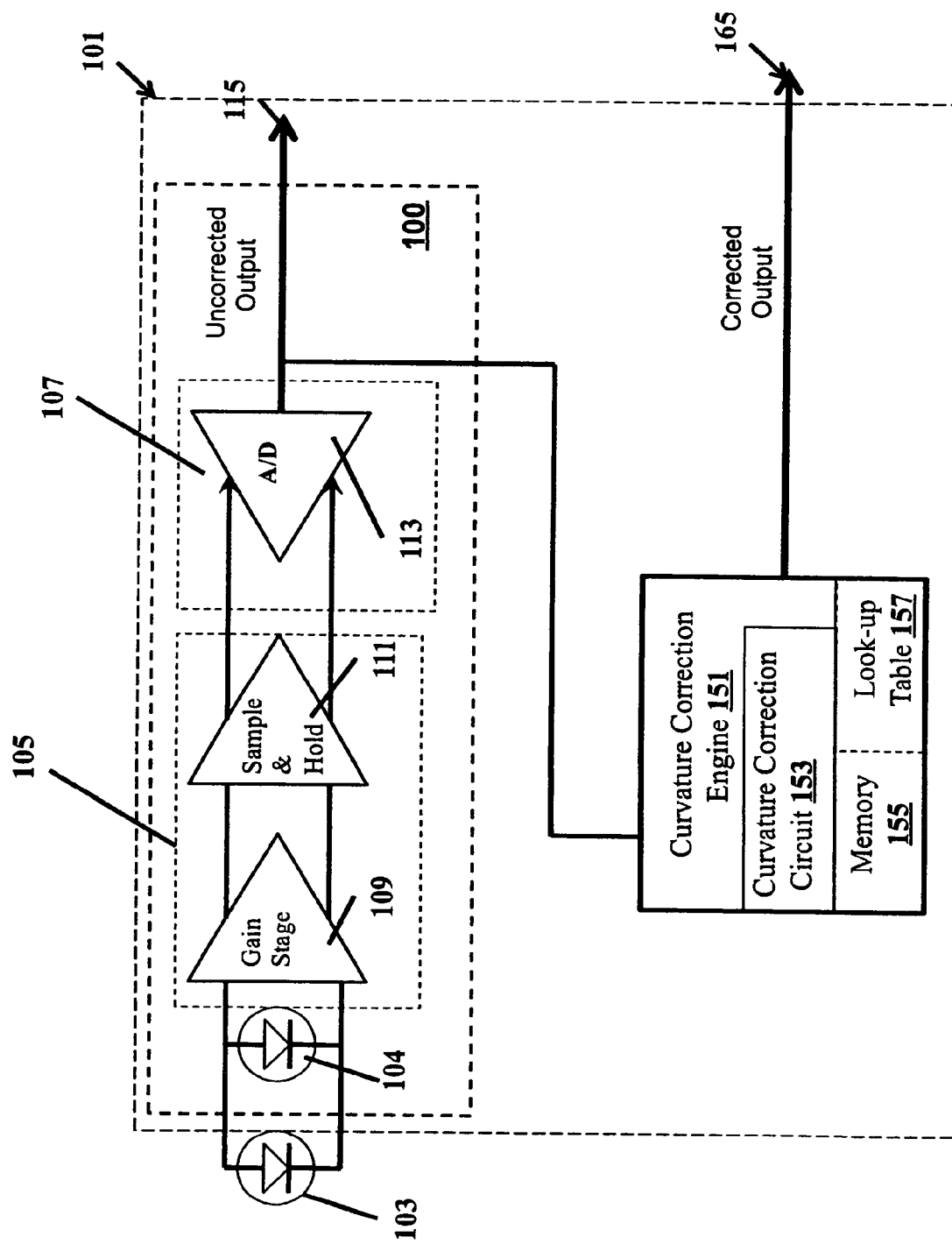
FIG. 1 illustrates a temperature measurement system in accordance with the invention.

FIG. 1 illustrates an exemplary temperature measurement system 100 in accordance with the principles of the invention. Temperature measurement system 100 is preferably fully integrated onto a single integrated circuit chip 101. System 100 receives one or more analog signals representative of the temperature of corresponding one or more temperature sensors 103, 104.

The one or more temperature sensors 103, 104 may be disposed internal to or external to chip 101 such as external temperature sensor 103 and internal temperature sensor 104. Although FIG. 1 shows only one external temperature sensor 103 and only one internal temperature sensor 104, it will be appreciated by those skilled in that art that a plurality of external temperature sensors 103 and/or a plurality of internal temperature sensors may be provided. It will be further appreciated by those skilled in the art that the temperature measurement system may include only internal temperature sensors 104.

Each temperature sensor 103, 104 may be any conventional type temperature sensor. In the illustrative embodiment, solid-state sensors are utilized. Each temperature sensor 103, 104 in the illustrative embodiment generates an analog output signal. Temperature measurement system 100 receives the analog output signal from each corresponding temperature sensor 103, 104 and provides a digital output representative of the temperature of a temperature sensor 103, 104.

As shown in FIG. 1 external solid-state sensor 103 is utilized to provide a temperature dependent output signal of the ambient area in which it is disposed. Similarly internal temperature sensor 104 generates a temperature dependent output signal of the ambient area of the substrate 101. Each solid-state sensor 103, 104 is represented in FIG. 1 as a diode, and may be a device having temperature characteristics of a diode, a diode connected transistor, or any other solid-state temperature sensor, including temperature sensors that incorporate a band gap structure. The output signal from solid-state sensor 103, 104 is an analog signal.

The analog outputs of each solid-state sensor 103, 104 are coupled to temperature measurement system 100. Temperature measurement system 100 is shown in exemplary form as comprising an analog signal portion 105 and a digital signal portion 107. Analog signal portion 105 is shown as comprising an input buffering stage 109 coupled to a sample-and-hold circuit 111. It will be appreciated by those skilled in the art that the analog signal portion 105 is exemplary and is not intended to limit the invention in any manner or respect since there are many other known analog signal portions which may be used to receive and buffer temperature sensor signals.

Although temperature sensors 103, 104 are shown connected to analog signal portion 105, it will be appreciated by those skilled in the art that various arrangements may be utilized to multiplex or switch temperature sensors 103, 104 to temperature measurement system 100.

Analog signal portion 105 is followed by a digital signal processing portion 107 that provides a digital output representation of temperature dependent signals from solid-state sensor 103, 104. In the embodiment of FIG. 1, digital signal processing portion 107 comprises an analog to digital converter 109.

Due to the characteristics of temperature sensors 103, 104 and the characteristics of temperature measurement system 100, digital output 115 includes nonlinear temperature dependent errors.

The present invention makes advantageous use of the repeatability of temperature effects. Because nearly all temperature effects are repeatable, they can be characterized and therefore corrected after the measurement is complete, provided that the temperature of the measurement system is accurately known.

Errors in the output of temperature measurement system 100 arise from the non-linear temperature dependent characteristics of solid state sensors 103, 104 and from the nonlinear temperature dependence of the internal temperature of measuring system chip 101 upon which temperature measurement system 100 is formed.

In the illustrative embodiment of the invention, error correction and temperature compensation are provided by utilizing corrections that are applied to the digital output signals.

The methodology of providing error correction in accordance with the principles of the invention may be applied to sensor based errors as well as errors arising from a temperature measurement system.

In accordance with the principles of the invention the following methodology is utilized in the illustrative embodiment to provide error correction for temperature measurement system 100.

The temperature of measurement system 100 is varied over a predetermined temperature range of interest. In the embodiment of the invention, the temperature of test measurement system is varied over the range of −40° C. to 125° C.

Output 115 of temperature measurement system 100 is recorded along with the corresponding temperature of test measurement system 100. As will be appreciated by those skilled in the art, the temperature of system 100 may be varied in incremental steps that are selected to be small with respect to the temperature range of interest. Still further, as those skilled in the art will appreciate the temperature of system 100 will be allowed to stabilize before the output 115 is recorded.

A correction curve is created by subtracting a digital representation of the actual known temperature of temperature sensor 103, 104 from each digital output generated by test measurement system 100 at each swept temperature to which system 100 is subjected. The differences are plotted against each corresponding temperature to which measurement system 100 is subjected.

Where system 100 is utilized with an external sensor 103, the temperature of temperature sensor 103 is held constant, any difference from the digital representation of the actual temperature of sensor 103 is due to the temperature dependent behavior of temperature measurement system 100.

In one embodiment of the invention, the temperature of temperature measuring system is swept at predetermined increments such as, from every 5° C. to 10° C., and the temperature output for each of those increments is utilized. In other embodiments, the sweep increments may be spaced apart by a different amount, e.g., every ⅛° C. or more.

Separate correction curves are determined for a predetermined statistically significant number of measurement systems 100.

Each separate error curve is fitted to an nth order polynomial. The order is selected based upon the overall shape of the curve and the noise of the measurement. This is done to remove both measurement and system 100 noise. In the illustrative embodiment a $9^{th}$ order polynomial is utilized.

The offset distribution of the error curves for the plurality of temperature measurement systems 100 can be accounted for using a single point trim techniques. The slope variations of the error curves for the plurality of temperature measurement systems 100 can also be accounted for using dual point trim techniques. The offset distribution is removed by averaging the plurality of measurement system 100 error curves at the selected trim temperature. Averaging the plurality of measurement system 100 error curve slopes and then trimming at two distinct temperatures removes the slope variation. If only a single point trim is used, then the temperature measurement system 100 error will be defined by the slope variation. In this manner the slope and offset, distributions and variations are accounted for and can be removed from the typical measurement system 100 error curve.

The error curves for the plurality of temperature measurement systems 100 are filtered to remove any outliers that may arise from measurement noise and errors.

The error curves are next averaged to create the typical shape for the error distribution.

The slopes that were removed are averaged for the same error curves.

Figure 2:
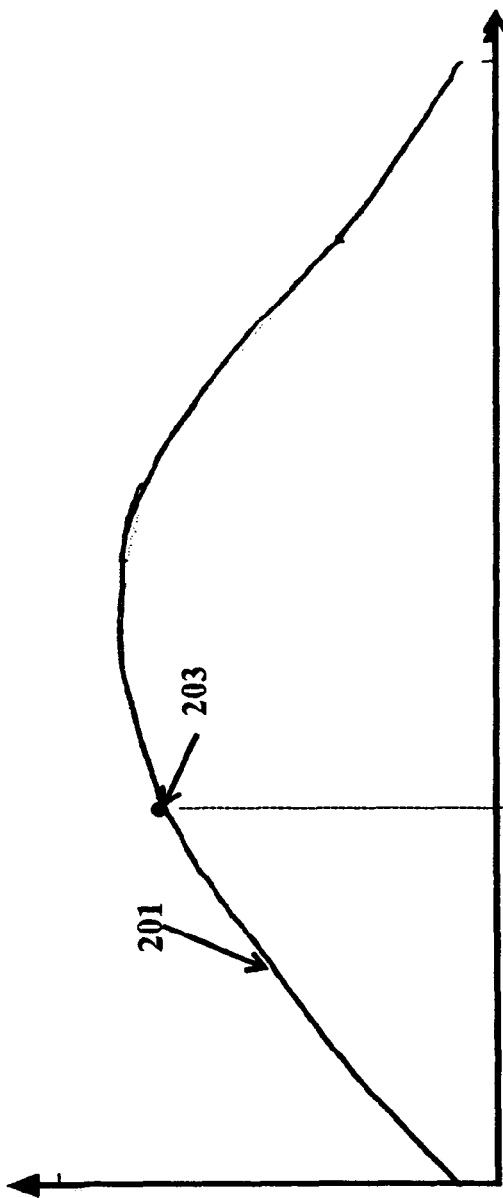
FIG. 2 illustrates an error curve.

The average slope and average error curves are merged into a final typical error curve for the distribution. Curve 201 shown in FIG. 2 illustrates an error curve for a statistically significant number of temperature measurement systems 100.

Figure 3:
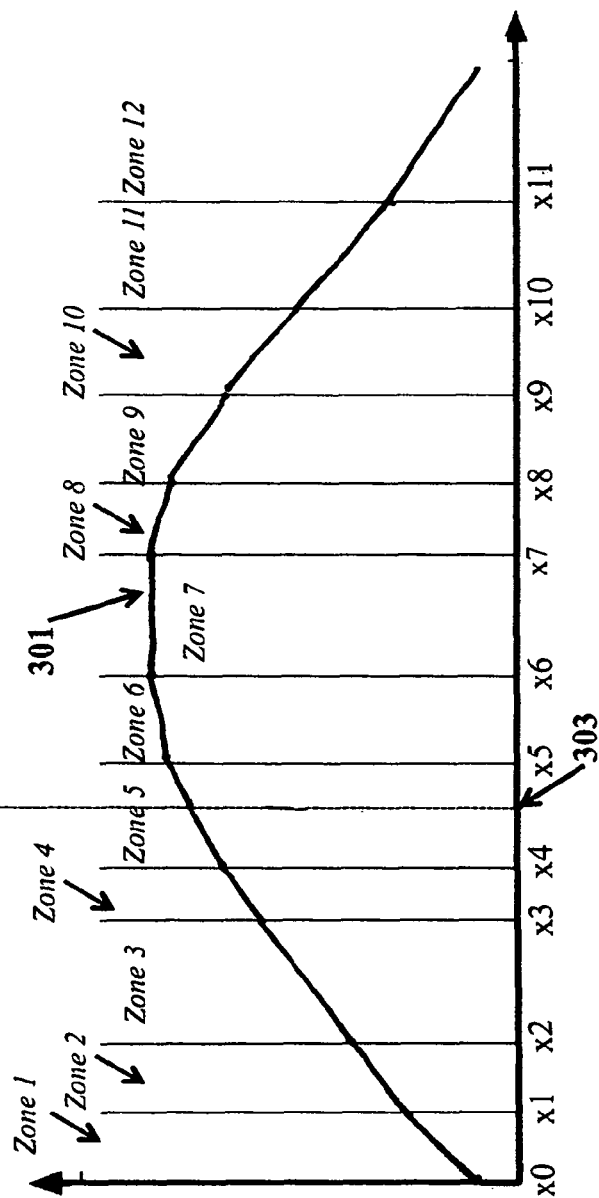
FIG. 3 illustrates a corresponding piece-wise linear approximation of the curve of FIG. 2.

A piece-wise linear based approximation 301 of error curve 201 for measurement system 100 is constructed as shown in FIG. 3. The number of segments or zones of the piece-wise linear approximation 301 is determined by and dependent upon a predetermined acceptable amount of acceptable error. The number of segments or zones is selected to minimize the number of segments needed to achieve the acceptable error.

By utilizing the piece-wise linear based approximation 301, corrections may be made to the digital output of temperature measurement system 100. More specifically each zone is defined by its end points x0, x1, x2, x3, x4, x5, x6, x7, x8, x9, x10, x11. In each zone, error correction is defined by both an error slope "m" and an error offset "b", such that in each zone, the error corrected output "y" for an uncorrected output "x" is defined by y=mx+b. Both the error slope "m" and the error offset "b" are determined for each zone and are constant within the zone. By way of non-limiting example for a temperature measurement system output that has a value "x" as indicated at point 303 in FIG. 3, that output "x" falls between outputs x4 and x5 that define zone 5.

By utilizing the correlation between each zone and the corresponding error slope and error offset, a digital memory may be utilized to store the error slopes and corresponding offset such that digital output 115 of a temperature measurement system is directly utilized to determine the appropriate error correction. Digital output 115 is utilized to identify a memory location corresponding to one of the zones zone 1-11 that contains the error slope and error offset that are then used to operate on the value of the digital output 115 to provide an error corrected output.

In the illustrative embodiment, an error correction engine 151 is coupled to temperature measurement system 100. Error correction engine 151 may be included on the same integrated circuit 101 that includes temperature measurement system 100 or may be separate from temperature measurement system 100. Error correction engine 151 operates on the uncorrected digital output 115 to generate an error corrected digital output 165.

Error correction engine 151 includes circuitry 153 that receives uncorrected digital output 115, and utilizes the digital output 115 to identify locations in a memory 155 based upon to which zone digital output 115 corresponds.

In one implementation of the invention, memory 155 includes a lookup table 157. Lookup table 157 that has a memory address for each zone as defined by the endpoints of the zone. That memory address is utilized to access one or more memory locations that contain the corresponding slope and offset to provide error correction in the zone.

In the illustrative embodiment of the invention curvature correction engine 151 utilizes digital output 115 to identify a corresponding zone. Each of zones 1-11 is defined by its respective endpoints. Processor 153 identifies locations in look-up table 157 that correspond to the zone of the digital output 115. The corresponding slope and offset for the zone are obtained from look-up table 157. Processor 153 utilizes the retrieved slope and offset and the uncorrected digital output 115 to calculate a corrected digital output 165.

While various embodiments have been described, those skilled in the art will recognize various changes, modifications or variations might be made without departing from the present disclosure. The embodiments described herein are not intended to limit the scope of the invention. It is intended that the invention be limited only by the claims appended hereto.

What is claimed is:

1. A method for providing an error corrected digital output from a temperature measurement system generating digital outputs representative of the output of one or more temperature sensors, said method comprising:

storing in a plurality of memory locations corresponding error correction data, each of said memory locations having a correlation to a corresponding range of said digital outputs;

utilizing each of said digital outputs to identify a corresponding one of said memory locations;

accessing said corresponding one memory location to obtain error correction data specific to each of said digital outputs;

establishing said error correction data from a piece-wise linear approximation of a characteristic error curve for said temperature measurement system;

said characteristic error curve is determined from a plurality of error curves obtained from a statistically significant number of measurement systems; and utilizing said error correction data specific to each of said digital outputs to correct each said digital output, whereby error corrected digital outputs are generated.

2. A method in accordance with claim 1, comprising:
providing circuitry to operate on each said digital output with said error correction data to generate said error corrected digital outputs.

3. A method in accordance with claim 1, comprising:
providing offset data and slope data as said error correction data.

4. A method in accordance with claim 1, comprising:
providing said temperature measurement system on a single integrated circuit.

5. A method in accordance with claim 4, comprising:
providing circuitry on said integrated circuit to operate on each said digital output with said error correction data to generate said corrected digital output.

6. A method in accordance with claim 5, comprising:
providing offset data and slope data as said error correction data.

7. A method in accordance with claim 1, comprising:
establishing a plurality of linear segments of said piece-wise linear approximation, said linear segments being determined from predetermined acceptable error limits; and utilizing each segment of said plurality of linear segments to determine corresponding said error correction data.

8. A method in accordance with claim 4, comprising:
providing at least one temperature sensor on said integrated circuit.

9. A method in accordance with claim 4, comprising:
providing an input to said integrated circuit for coupling to a temperature sensor external to said integrated circuit.

10. A method for providing an error corrected digital output from a temperature measurement system generating digital outputs representative of the output of one or more temperature sensors, said method comprising:

providing a plurality of error correction information sets for said measurement system;

generating said plurality of error correction information sets by:

producing a typical error curve;

providing a piece-wise linear representation of said typical error curve comprising a plurality of segments; and minimizing the number of said segments in said piece-wise linear representation to achieve a predetermined acceptable error; and utilizing said segments to generate error correction information sets;

storing said plurality of error correction information sets in a corresponding plurality of memory locations;
associating each of each of said memory locations to a corresponding range of said digital outputs;
utilizing each said digital output to identify a corresponding one of said memory locations;
accessing said corresponding one memory location to obtain a corresponding said error correction information set; and
utilizing said corresponding error correction data set to correct said digital output, whereby an error corrected digital output is generated.

11. A method in accordance with claim 10, comprising:
utilizing said digital output to access a particular corresponding segment error correction information set to correct said digital output.

12. A method in accordance with claim 11 comprising:
providing a memory for storing said plurality of error correction information sets in a plurality of corresponding locations; and
storing each said error correction information set in a predetermined location that has a correlation to its corresponding said segment.

13. A method in accordance with claim 12, comprising;
utilizing each said digital output to access a corresponding memory location based upon a corresponding said segment.

14. A method in accordance with claim 12, comprising:
providing said temperature measurement system on a single integrated circuit.

15. A method in accordance with claim 14, comprising:
providing circuitry on said integrated circuit to operate on each said digital output with said error correction data to generate said corrected digital output.

16. A method in accordance with claim 15, comprising:
providing offset data and slope data as said error correction data.

17. A method in accordance with claim 10, comprising:
providing said temperature measurement system on a single integrated circuit.

18. A method in accordance with claim 17, comprising:
providing circuitry on said integrated circuit to operate on each said digital output with said error correction data to generate said corrected digital output.

19. A method in accordance with claim 18, comprising:
providing offset data and slope data as said error correction data.

20. A method for providing an error corrected digital output from a temperature measurement system generating digital outputs representative of the output of one or more temperature sensors, said method comprising:
storing in a plurality of memory locations corresponding error correction data, each of said memory locations having a correlation to a corresponding range of said digital outputs;
utilizing each of said digital outputs to identify a corresponding one of said memory locations;
accessing said corresponding one memory location to obtain error correction data specific to each of said digital outputs;
establishing said error correction data from a piece-wise linear approximation of a characteristic error curve for said temperature measurement system;
establishing a plurality of linear segments of said piece-wise linear approximation, said linear segments being determined from predetermined acceptable error limits; and
utilizing each segment of said plurality of linear segments to determine corresponding said error correction data; and
utilizing said error correction data specific to each of said digital outputs to correct each said digital output, whereby error corrected digital outputs are generated.

* * * * *